US010420232B2

(12) United States Patent
Kamenšek et al.

(10) Patent No.: US 10,420,232 B2
(45) Date of Patent: Sep. 17, 2019

(54) DIN RAIL DEVICE MOUNT ASSEMBLIES, SYSTEMS AND METHODS INCLUDING LOCKING MECHANISMS

(71) Applicant: Raycap, Surge Protective Devices, Ltd., Komenda (SI)

(72) Inventors: Sebastjan Kamenšek, Škofja Loka (SI); Milenko Vukotić, Ljubljana (SI); Igor Juričev, Izola (SI); Jure Vrhunc, Ljubljana (SI); Tadej Knez, Grosuplje (SI)

(73) Assignee: Raycap, Surge Protective Devices, Ltd., Komenda (SI)

( * ) Notice: Subject to any disclaimer, the term of this patent is extended or adjusted under 35 U.S.C. 154(b) by 479 days.

(21) Appl. No.: 15/134,676

(22) Filed: Apr. 21, 2016

(65) Prior Publication Data
US 2017/0311462 A1 Oct. 26, 2017

(51) Int. Cl.
*H05K 5/02* (2006.01)
*H01H 71/02* (2006.01)
(Continued)

(52) U.S. Cl.
CPC ......... *H05K 5/0221* (2013.01); *H01H 71/025* (2013.01); *H01H 83/10* (2013.01);
(Continued)

(58) Field of Classification Search
CPC ...... H01H 71/025; H01H 9/223; H01H 83/10; H01H 85/54; H05K 5/0221; H02B 1/052; H02B 1/0523; H01R 9/2641; H01T 4/06
(Continued)

(56) References Cited

U.S. PATENT DOCUMENTS

D570,801 S 6/2008 Allen
D684,539 S 6/2013 Akana et al.
(Continued)

FOREIGN PATENT DOCUMENTS

DE 103 49 660 A1 6/2005
DE 10 2006 033 274 A1 1/2008
(Continued)

OTHER PUBLICATIONS

Extended European Search Report Corresponding to European Application No. 17158035.0; dated Aug. 17, 2017; 7 Pages.
(Continued)

*Primary Examiner* — Kevin J Comber
(74) *Attorney, Agent, or Firm* — Myers Bigel, P.A.

(57) ABSTRACT

A DIN rail device mount system includes a base, a module and a locking mechanism. The base is configured to be mounted on a DIN rail. The base defines a receiver slot. The module is configured to be removably mounted in the receiver slot to form a DIN rail mount assembly. The locking mechanism includes: a lock member having opposed proximal and distal ends and including an integral lock member latch feature on its distal end, wherein the lock member is pivotally connected to the base at its proximal end to pivot between a closed position and an open position; and an integral module latch feature on the module. The DIN rail mount system is selectively positionable in each of: a locked configuration wherein the module is seated in the receiver slot, the lock member is in the closed position, and the lock member latch feature is interlocked with the module latch feature, whereby the lock member secures the module in the receiver slot; and an unlocked configuration wherein the lock member is in the open position, the lock member latch feature is not interlocked with the module latch feature, and the module can be withdrawn from the receiver slot.

20 Claims, 8 Drawing Sheets

(51) Int. Cl.
*H01H 83/10* (2006.01)
*H01H 85/54* (2006.01)
*H02B 1/052* (2006.01)
*H01H 9/22* (2006.01)
*H01R 9/26* (2006.01)
*H01T 4/06* (2006.01)

(52) U.S. Cl.
CPC .............. *H01H 85/54* (2013.01); *H02B 1/052* (2013.01); *H01H 9/223* (2013.01); *H01R 9/2641* (2013.01); *H01T 4/06* (2013.01); *H02B 1/0523* (2013.01)

(58) Field of Classification Search
USPC ......................................................... 361/91.1
See application file for complete search history.

(56) References Cited

U.S. PATENT DOCUMENTS

| | | | |
|---|---|---|---|
| D697,029 S | 1/2014 | Chiu | |
| D704,630 S | 5/2014 | Liu | |
| 8,865,339 B2 | 10/2014 | Enari et al. | |
| D716,731 S | 11/2014 | Johnson | |
| D721,646 S | 1/2015 | Kim | |
| D756,916 S | 5/2016 | Yang | |
| D762,178 S | 7/2016 | Liu et al. | |
| D764,415 S | 8/2016 | Qian et al. | |
| D765,031 S | 8/2016 | Mielnik et al. | |
| D768,586 S | 10/2016 | Christianson et al. | |
| D782,980 S | 4/2017 | Zhang et al. | |
| 2006/0121770 A1 | 6/2006 | Hammer et al. | |
| 2009/0023308 A1* | 1/2009 | Guan | H01R 12/7005 439/62 |
| 2010/0020459 A1* | 1/2010 | Goschl | H01T 4/06 361/117 |
| 2012/0047288 A1* | 2/2012 | Kretschmann | H05K 7/1468 710/8 |
| 2012/0081828 A1* | 4/2012 | Gillespie | H01R 9/2433 361/118 |

FOREIGN PATENT DOCUMENTS

| | | |
|---|---|---|
| DE | 20 2008 004 699 U1 | 7/2008 |
| DE | 10 2008 021 210 A1 | 8/2009 |
| DE | 10 2008 017 423 A1 | 10/2009 |
| DE | 20 2006 021 210 U1 | 11/2013 |
| EP | 2 784 885 A1 | 10/2014 |
| EP | 2 919 338 A1 | 9/2015 |
| WO | WO 2008/009507 A1 | 1/2008 |

OTHER PUBLICATIONS

"Din Rail Boxes" Camden Boss Electronics & Enclosures; URL: http://camdenboss.com/media/category/files/vertical_box_for_din_rail.pdf (2 pages) (Feb. 23, 2017).
European Office Action corresponding to European Application No. 17158035.0 (6 pages) (dated Oct. 8, 2018).

* cited by examiner

DIN RAIL DEVICE MOUNT ASSEMBLIES, SYSTEMS AND METHODS INCLUDING LOCKING MECHANISMS

FIELD OF THE INVENTION

The present invention relates to DIN rail mounted devices and, more particularly, to locking mechanisms for DIN rail mounted devices.

BACKGROUND OF THE INVENTION

Overvoltage protection devices, circuit breakers, fuses, ground connections and the like are often mounted on DIN (Deutsches Institut fur Normung e.V.) rails. DIN rails may serve as mounting brackets of standardized dimensions so that such electrical control devices may be sized and configured to be readily and securely mounted to a support surface such as an electrical service utility box.

SUMMARY

According to some embodiments, a DIN rail device mount system includes a base, a module and a locking mechanism. The base is configured to be mounted on a DIN rail. The base defines a receiver slot. The module is configured to be removably mounted in the receiver slot to form a DIN rail mount assembly. The locking mechanism includes: a lock member having opposed proximal and distal ends and including an integral lock member latch feature on its distal end, wherein the lock member is pivotally connected to the base at its proximal end to pivot between a closed position and an open position; and an integral module latch feature on the module. The DIN rail mount system is selectively positionable in each of: a locked configuration wherein the module is seated in the receiver slot, the lock member is in the closed position, and the lock member latch feature is interlocked with the module latch feature, whereby the lock member secures the module in the receiver slot; and an unlocked configuration wherein the lock member is in the open position, the lock member latch feature is not interlocked with the module latch feature, and the module can be withdrawn from the receiver slot.

In some embodiments, the module latch feature includes a recess defined in the module, and the lock member latch feature includes a latch finger configured to be received in the recess to interlock the lock member latch feature with the module latch feature. In some embodiments, the recess is defined in a distal end of the module, and the latch finger is located on the distal end of the lock member.

According to some embodiments, when the DIN rail mount system is in the locked configuration, a distal end portion of the module extends outwardly beyond a distal end of the receiver slot. In some embodiments, when the DIN rail mount system is in the locked configuration, the lock member is seated in a recess defined in the distal end portion of the module.

According to some embodiments, the module includes an integral module guide feature, the base includes an integral base guide feature, and the module guide feature and the base guide feature align the module with the base as the module is inserted in the receiver slot and, when the DIN rail mount system is in the locked configuration, prevent the module from being laterally displaced from the receiver slot. In some embodiments, the module guide feature includes a perimeter flange extending along an outer lateral side edge of the module, and the base guide feature includes a perimeter groove extending along an outer lateral side edge of the base adjacent the receiver opening.

In some embodiments, when the DIN rail mount system is in the locked configuration, the lock member is axially inset from or coplanar with a front face of the module.

In some embodiments, the module includes a module housing defining a cavity, and an overvoltage protection device mounted in the cavity.

According to some embodiments, the base includes a second receiver slot, and the DIN rail device mount system includes a second module and a second locking mechanism. The second locking mechanism includes: a second lock member having opposed proximal and distal ends and including a second integral lock member latch feature on its distal end, wherein the second lock member is pivotally connected to the base at its proximal end to pivot between a closed position and an open position; and a second integral module latch feature on the second module. The DIN rail mount system is selectively positionable in each of: a locked configuration wherein the second module is seated in the second receiver slot, the second lock member is in the closed position, and the second lock member latch feature is interlocked with the second module latch feature, whereby the second lock member secures the second module in the second receiver slot; and an unlocked configuration wherein the second lock member is in the open position, the second lock member latch feature is not interlocked with the second module latch feature, and the second module can be withdrawn from the second receiver slot.

In some embodiments, the base includes a DIN rail mount receiver channel configured to receive a DIN rail to secure the base to the DIN rail.

According to method embodiments of the invention, a method for using a DIN rail device mount system includes providing a DIN rail device mount system including a base, a module and a locking mechanism. The base is configured to be mounted on a DIN rail, the base defining a receiver slot. The module is configured to be removably mounted in the receiver slot to form a DIN rail mount assembly. The locking mechanism includes: a lock member having opposed proximal and distal ends and including an integral lock member latch feature on its distal end, wherein the lock member is pivotally connected to the base at its proximal end to pivot between a closed position and an open position; and an integral module latch feature on the module. The method further includes selectively positioning the DIN rail mount system in each of: a locked configuration wherein the module is seated in the receiver slot, the lock member is in the closed position, and the lock member latch feature is interlocked with the module latch feature, whereby the lock member secures the module in the receiver slot; and an unlocked configuration wherein the lock member is in the open position, the lock member latch feature is not interlocked with the module latch feature, and the module can be withdrawn from the receiver slot.

In some embodiments, the module latch feature includes a recess defined in the module, and the lock member latch feature includes a latch finger configured to be received in the recess to interlock the lock member latch feature with the module latch feature. In some embodiments, the recess is defined in a distal end of the module, and the latch finger is located on the distal end of the lock member.

According to some embodiments, when the DIN rail mount system is in the locked configuration, a distal end portion of the module extends outwardly beyond a distal end of the receiver slot. In some embodiments, when the DIN rail mount system is in the locked configuration, the lock member is seated in a recess defined in the distal end portion of the module.

According to some embodiments, the module includes an integral module guide feature, the base includes an integral base guide feature, and the module guide feature and the base guide feature align the module with the base as the module is inserted in the receiver slot and, when the DIN rail mount system is in the locked configuration, prevent the module from being laterally displaced from the receiver slot. In some embodiments, the module guide feature includes a perimeter flange extending along an outer lateral side edge of the module, and the base guide feature includes a perimeter groove extending along an outer lateral side edge of the base adjacent the receiver opening.

In some embodiments, when the DIN rail mount system is in the locked configuration, the lock member is axially inset from or coplanar with a front face of the module.

According to some embodiments, the module includes a module housing defining a cavity, and an overvoltage protection device mounted in the cavity.

In some embodiments, the base includes a second receiver slot and the DIN rail device mount system includes a second module and a second locking mechanism. The second locking mechanism includes: a second lock member having opposed proximal and distal ends and including a second integral lock member latch feature on its distal end, wherein the second lock member is pivotally connected to the base at its proximal end to pivot between a closed position and an open position; and a second integral module latch feature on the second module. The method further includes selectively positioning the DIN rail mount system in each of: a locked configuration wherein the second module is seated in the second receiver slot, the second lock member is in the closed position, and the second lock member latch feature is interlocked with the second module latch feature, whereby the second lock member secures the second module in the second receiver slot; and an unlocked configuration wherein the second lock member is in the open position, the second lock member latch feature is not interlocked with the second module latch feature, and the second module can be withdrawn from the second receiver slot.

According to some embodiments, the base includes a DIN rail mount receiver channel, and the method includes mounting the base on the DIN rail such that the DIN rail is received in the DIN rail mount receiver channel to secure the base to the DIN rail.

Further features, advantages and details of the present invention will be appreciated by those of ordinary skill in the art from a reading of the figures and the detailed description of the preferred embodiments that follow, such description being merely illustrative of the present invention.

BRIEF DESCRIPTION OF THE DRAWINGS

The accompanying drawings, which form a part of the specification, illustrate embodiments of the present invention.

DETAILED DESCRIPTION OF EMBODIMENTS OF THE INVENTION

Figure 1:
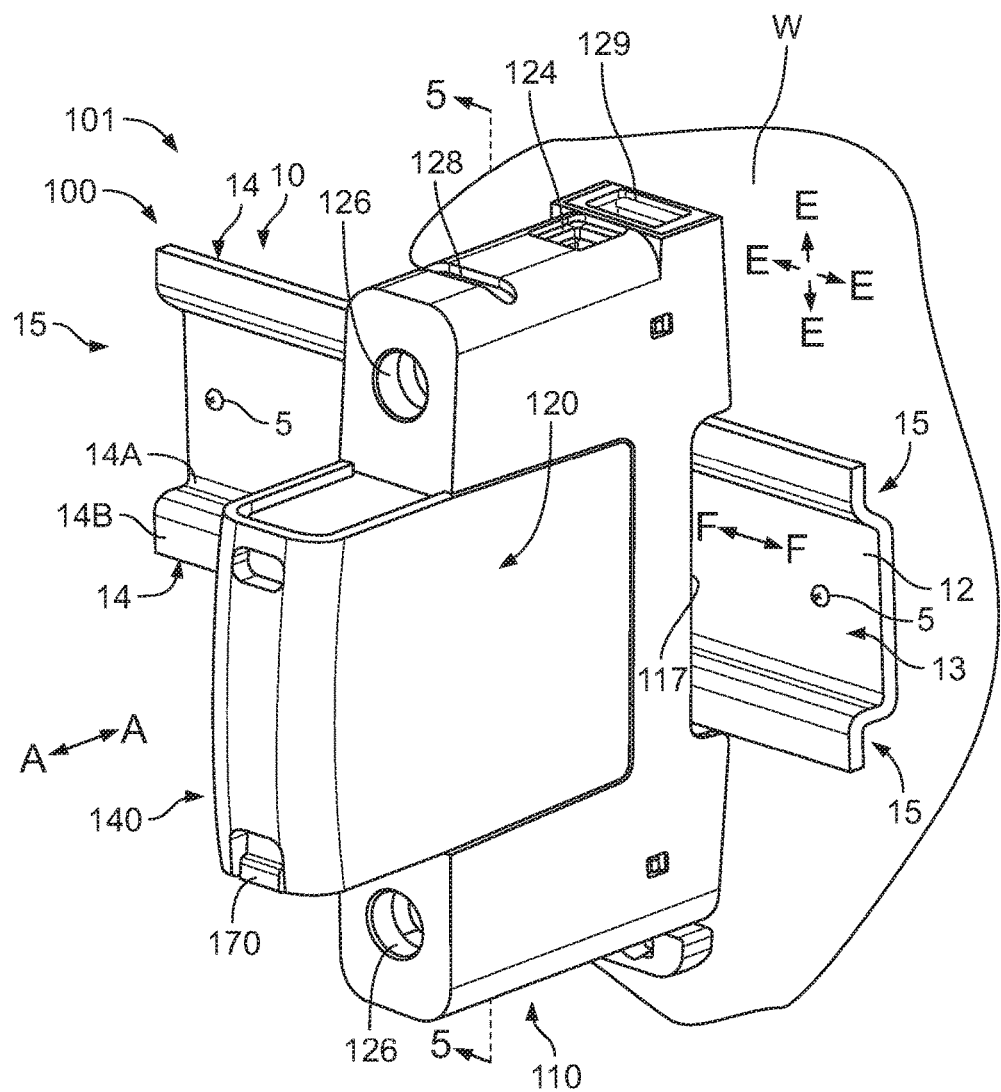
FIG. 1 is a top, front perspective view of a DIN rail device mount system and a DIN rail device mount assembly according to embodiments of the invention, wherein the DIN rail device mount system is in a locked configuration.
Figure 2:
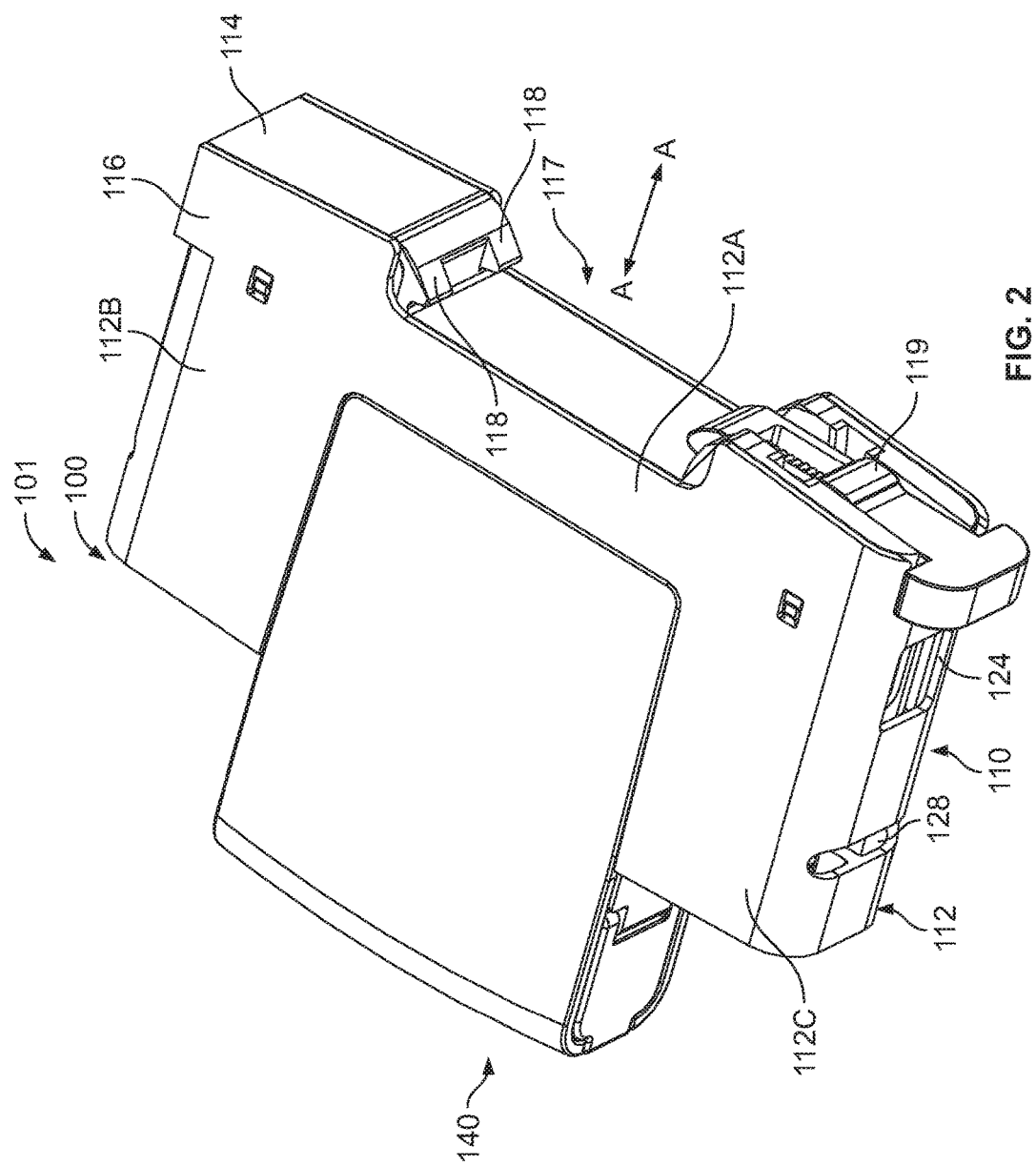
FIG. 2 is a bottom, rear perspective view of the DIN rail device mount assembly of FIG. 1, wherein the DIN rail device mount system is in the locked configuration.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "monolithic" means an object that is a single, unitary piece formed or composed of a material without joints or seams.

With reference to FIGS. 1-7, a DIN rail device mount system 101 according to embodiments of the present invention and a DIN rail device mount assembly 100 formed therefrom are shown therein. According to some embodiments and as shown, the assembly 100 is configured, sized and shaped for mounting on a support rail 10 (e.g., DIN rail 10 shown in FIG. 1) and is compliant with corresponding applicable DIN requirements or standards. The DIN rail 10 may be secured (e.g., by screws 5 or other fasteners) to a suitable support structure such as a wall W, for example, a rear wall of an electrical service utility cabinet.

As discussed in more detail below, the system 101 includes a pedestal or base 110 that is removably mountable on the DIN rail 10 and a module 140 that is in turn removably mountable on the base 110. The module 140 may include one or more functional components 166 (FIG. 5) such as an electrical device (e.g., an overvoltage protection element or circuit). The system 101 and the DIN rail 10 together form a mounting system 15 for affixing the functional component(s) to the wall W.

According to some embodiments and as shown, the rail 10 is a DIN rail. That is, the rail 10 is a rail sized and configured to meet DIN specifications for rails for mounting modular electrical equipment.

The DIN rail 10 has a rear wall 12 and integral, lengthwise flanges 14 extending outwardly from the rear wall 12. Each flange 14 includes a forwardly extending wall 14A and an outwardly extending wall 14B. The walls 12, 14 together form a lengthwise extending front, central channel 13 and opposed, lengthwise extending, rear, edge channels 15. Mounting holes 16 may be provided extending fully through the wall 12 and to receive fasteners (e.g., threaded fasteners or rivets) for securing the rail 10 to a support structure (e.g., a wall or panel). The DIN rail 10 defines a DIN rail plane E-E and has a lengthwise axis F-F extending in the plane E-E. DIN rails of this type may be referred to as "top hat" support rails.

According to some embodiments, the rail 10 is a 35 mm (width) DIN rail. According to some embodiments, the rail 10 is formed of metal and/or a composite or plastic material.

The assembly 100 has a DIN rail mount assembly axis A-A (FIG. 1) that extends transversely to and, in some embodiments, substantially perpendicular to the axis F-F of the DIN rail 10. In some embodiments, the DIN rail mount assembly axis A-A extends transversely to and, in some embodiments, substantially orthogonal to the plane E-E of the DIN rail 10. As used herein, "front" or "distal" refers to the end farther away from the DIN rail 10 when the assembly 100 is mounted on the DIN rail 10, and "rear" or "proximal" refers to the end nearer the DIN rail 10.

The base 110 includes a rear housing member 114 and a front housing member 116 collectively forming a housing 112. The housing 112 includes a rear section 112A, an upper leg or section 112B, and a lower leg or section 112C. The housing 112 defines an enclosed internal cavity 122. According to some embodiments, the housing members 114, 116 are formed of an electrically insulating polymeric material.

A DIN rail receiver channel 117 is defined in the rear side of the rear section 112A. Integral rail hook features 118 are located on one side of the channel 117 and a spring loaded DIN rail latch mechanism 119 is mounted on the other side of the channel 117. The features and components 117, 116 and 119 are sized and configured to securely and releasably mount the unit 100 on a standard DIN rail 10 as is known in the art.

A receiver slot 120 is defined in the front side of the base 110 by the sections 112A, 112B, 112C. The receiver slot 120 has a front opening 120A and is open on either side. The receiver slot 120 extends axially from the opening 120A along the axis A-A and is terminated by the front side of the rear section 112A. A continuous, U-shaped perimeter groove 134 is defined in the inner edges of the sections 112A, 112B, 112C on either lateral side of the receiver slot 120.

Each of the upper and lower sections 112B, 112C includes an electrical connector 162. The connectors 162 may be clamp connectors as shown. Each connector 162 includes an actuator mechanism (e.g., in the form a screw 162A), a cable contact portion 162B and a module contact portion 162C. A cable port 124 is defined in each of the upper and lower sections 112B, 112C to receive a terminal end of an electrical cable 20 into the corresponding cable contact portion 162B. A driver port 126 is provided in each section 112B, 112C to operate the screw 162A of the associated electrical connector 162.

Each section 112B, 112C also includes a busbar connection slot 128. The upper section 112B includes an opening 129 to receive a remote control connector.

Upper and lower contact sockets 130 are defined in the front side of the rear section 112A. The module contact portions 162C of the connectors 162 are located adjacent the sockets 130.

Two voltage selector pin sockets 132 are also defined in the front side of the rear section 112A.

A remote control pin 136 projects forwardly from the front side of the rear section 112A.

Figure 5:
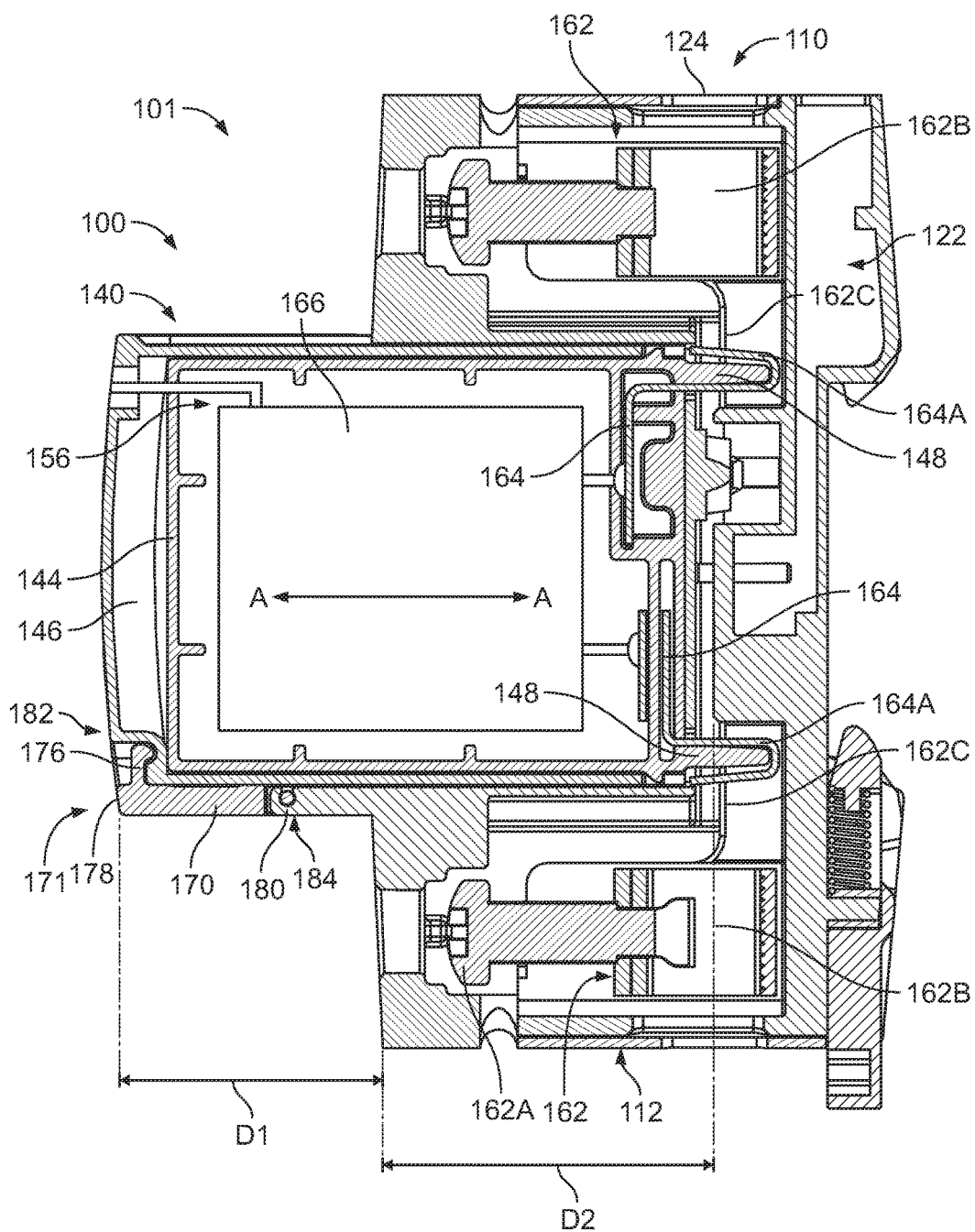
FIG. 5 is a cross-sectional view of the DIN rail device mount assembly of FIG. 1 taken along the line 5-5 of FIG. 1.

The module 140 includes an inner housing member 144 and an outer housing member 146 collectively forming a housing 142 (FIG. 5). The housing 142 defines an internal chamber or cavity 156. The housing includes a rear wall 142A, a front wall 142B, a top wall 142C, a bottom wall 142D, and opposed side walls 142E.

A continuous, U-shaped perimeter flange 154 extends upwardly from the upper edges of the side walls 142E and front wall 142B of the housing 142. Another continuous, U-shaped perimeter flange 154 extends downwardly from the lower wedges of the side walls 142E and front wall 142B. The flanges 154 define upper and lower inset channels 154A.

Two module contact members 164 are mounted in the module 140 and extend through the rear wall 142A. Each contact member 164 includes a U-shaped contact section 164A projecting rearwardly beyond the rear wall 142A. A pair of integral contact support posts 148 project rearwardly from the rear wall 142A and are each received in and support a respective one of the contact sections 164A.

Two voltage selector pins 150 project rearwardly from the rear wall 142A.

An indicator 152 is provided on the front wall 142B. The indicator 152 may serve to indicate a change in status of the module 140. For example, the indicator 152 may change colors or illuminate when a circuit breaker in the module 140 has tripped.

The functional component 166 may be any suitable device or component(s). In some embodiments, the functional component 166 is an electrical device. In some embodiments, the functional component 166 is an overvoltage protection device. In some embodiments, the functional component 166 is an electrical surge protection device. In some embodiments, the functional component 166 includes a metal oxide varistor (MOV), a circuit breaker, fuse, gas discharge tube (GDT) or diode.

The locking mechanism 171 includes a J-shaped clip or lock member 170, a base hinge feature 180, and a module latch feature 182. As described in more detail below, the lock member 170 is coupled to the base 110 by a hinge 184.

The lock member 170 is elongate and has a proximal end 170A and an opposing distal end 170B. The lock member 170 includes an axially extending body 172. Recesses 172A may be defined in the body 172 to reduce weight and material cost.

Figure 6:
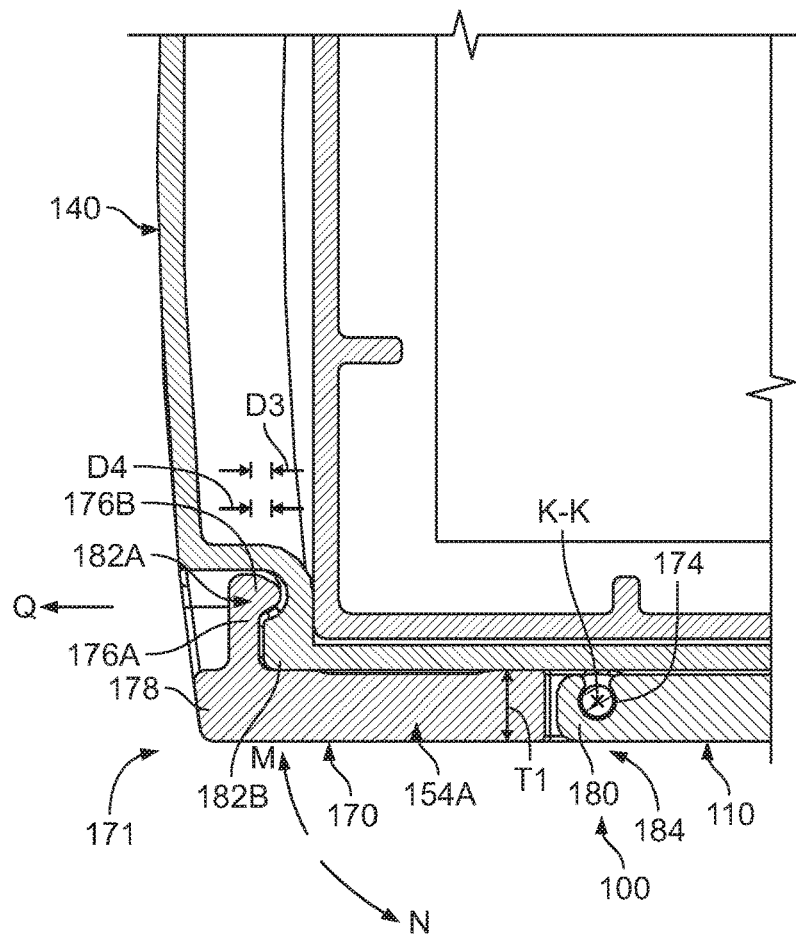
FIG. 6 is an enlarged cross-sectional view of the DIN rail device mount assembly of FIG. 1 taken along the line 5-5 of FIG. 1.
Figure 7:
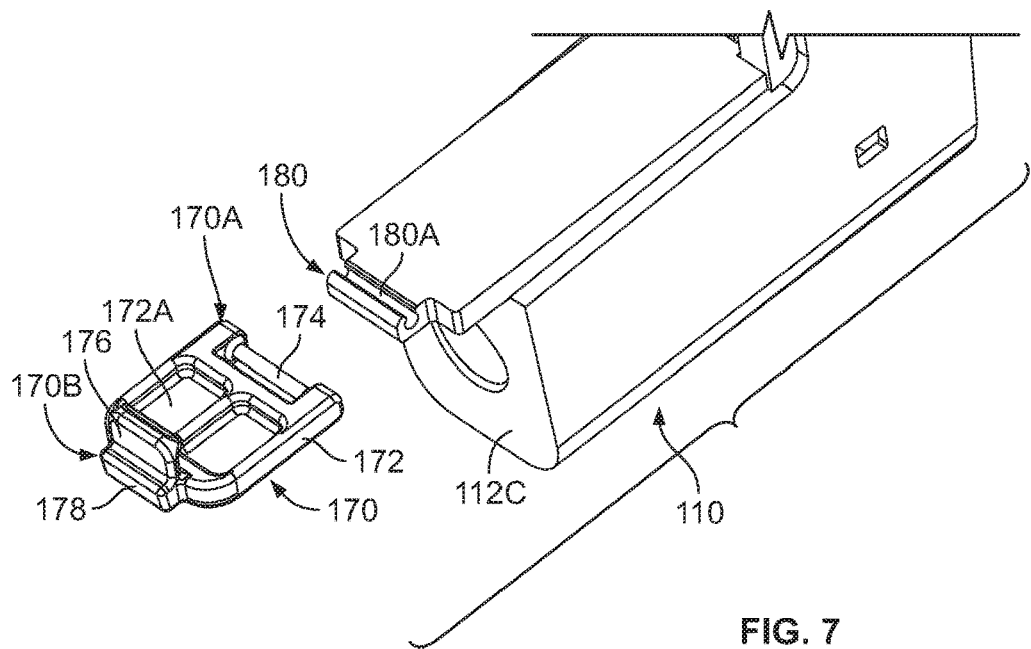
FIG. 7 is an exploded, top, front perspective view of a base and lock member forming parts of the DIN rail device mount system of FIG. 1.

An integral hinge feature 174 in the form of a hinge rod or axle is located on the proximal end 170A. An integral latch feature 176 (FIG. 7) is located on the distal end 170B. The latch feature 176 includes a vertically extending arm or extension 176A and a barb or latch finger 176B extending rearwardly from the free end of the extension 176A (FIG. 6). An integral operator manipulation feature or tab 178 projects forwardly from the front or distal end 170B of the lock member 170.

The base hinge feature 180 may be integrally formed with and projects forwardly from the front or distal end of the lower housing section 112C. The base hinge feature 180 forms a laterally extending groove 180A. The hinge axle 174 is received and pivotally secured in the groove 180A to form the hinge 184. More particularly, the lock member 170 can be pivoted relative to the base 110 about a pivot axis K-K in each of a latching direction M and an unlatching direction N. According to some embodiments and as show, the pivot axis K-K is transverse to and, in some embodiments, substantially perpendicular to, the DIN rail mount device axis F-F.

In alternative embodiments, the rod or axle type integral hinge feature may be provided as the base hinge feature 180 and the axle receiving groove type integral hinge feature may be provided as the integral hinge feature 174 of the lock member 170.

The module latch feature 182 is integrally formed with the front wall 142B of the module 140 on the front or distal end of the module 140. The module latch feature 182 includes a recess 182A and a lip 182B. The recess 182A is frontwardly opening and has an axial depth D4 (FIG. 6).

The housing members 114, 116, 144, 146 and the lock member 170 may be formed of any suitable material or materials. In some embodiments, each of the housing members 114, 116, 144, 146 and the lock member 170 are formed off a rigid polymeric material. Suitable polymeric materials may include polyamide (PA), polypropylene (PP), polyphenylene sulfide (PPS), or ABS, for example.

In some embodiments, the lock member 170 is integrally molded and, in some embodiments, is monolithic.

In some embodiments, the base hinge feature 180 is integrally molded with and, in some embodiments, is monolithic with the housing 112.

In some embodiments, the module latch feature 182 is integrally molded with and, in some embodiments, is monolithic with the housing 142.

The electrical contact portions 162B, 162C, 164 may be formed of any suitable electrically conductive material. According to some embodiments, these portions are formed of metal such as copper.

In some embodiments, the maximum dimensions of the assembly 100 are compliant with at least one of the following DIN Standards: DIN 43 880 (December 1988). In some embodiments, the maximum dimensions of the assembly 100 are compliant with each of these standards.

The system 101 may be used as follows in accordance with methods of the present invention.

The base 110 is mounted on the DIN rail 10 as shown in FIG. 1. The DIN rail 10 is received in the channel 117 and secured by the hooks 118 and the latch mechanism 119.

Cables 20 (shown in dashed line) are inserted through the cable ports 124 and secured in the connectors 162. A remote control connector (not shown) may be inserted into the port 129.

Figure 3:
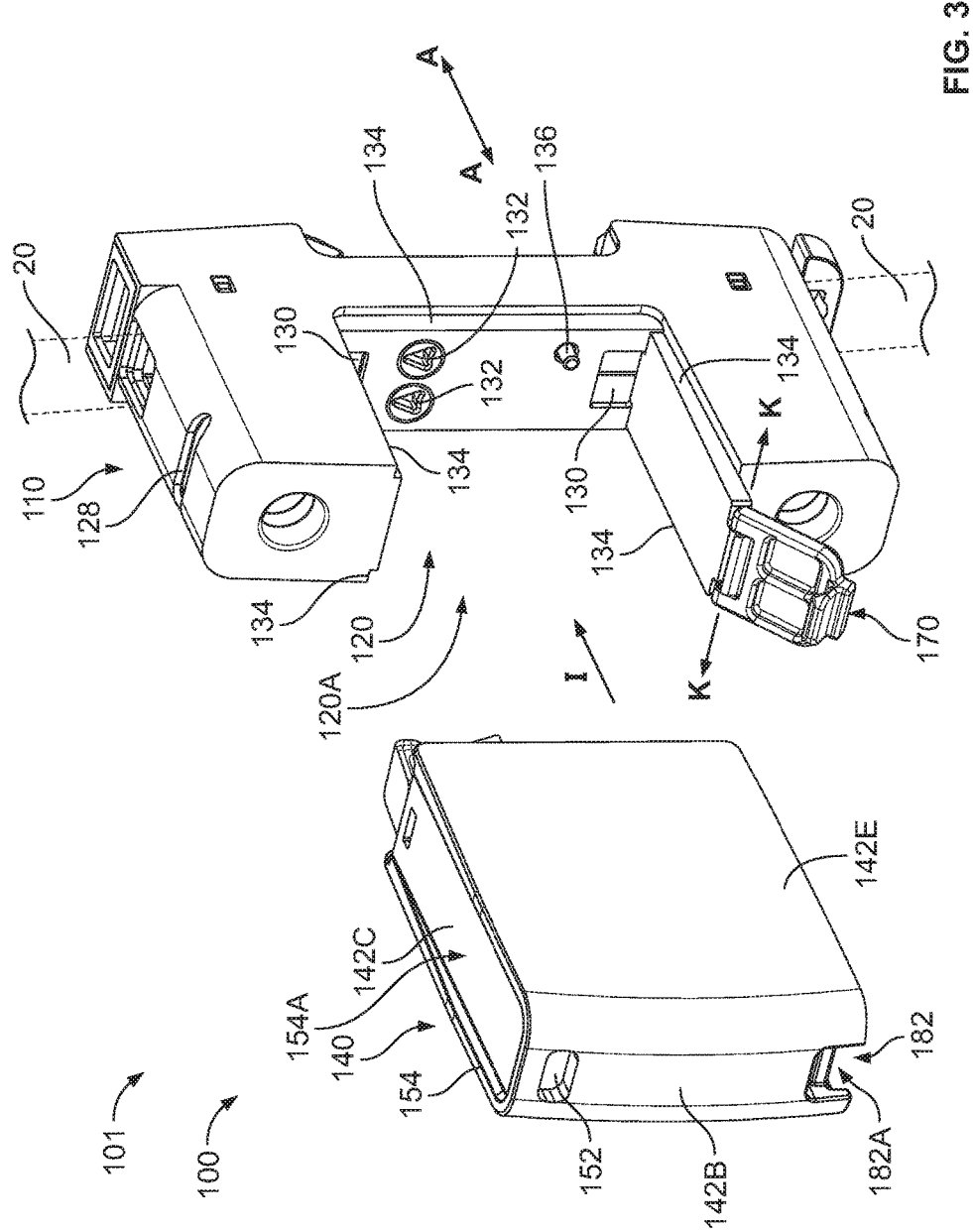
FIG. 3 is an exploded, top, front perspective view of the DIN rail device mount system of FIG. 1, wherein the DIN rail device mount system is in an unlocked configuration.
Figure 4:
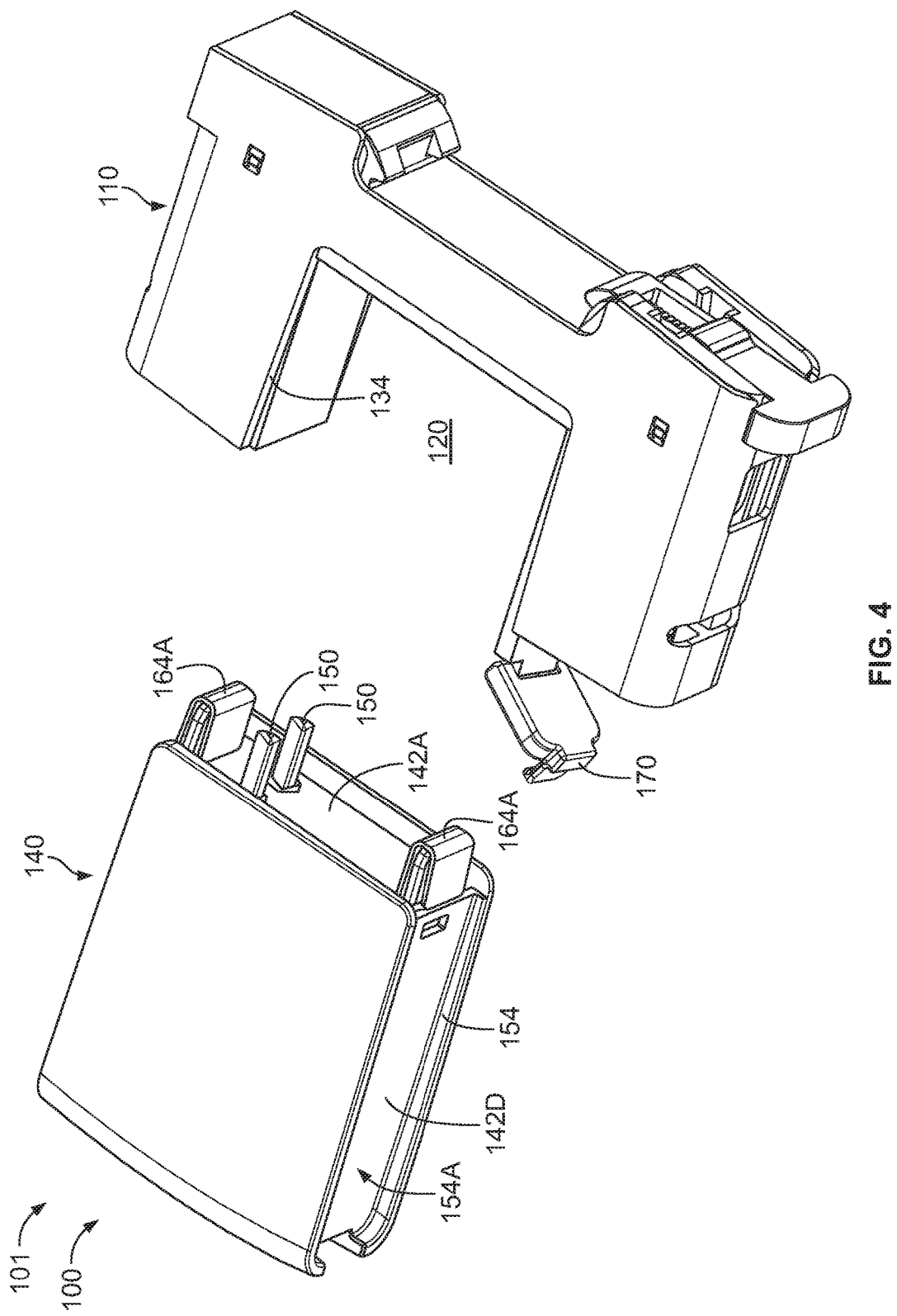
FIG. 4 is an exploded, bottom, rear perspective view of the DIN rail device mount assembly of FIG. 1 in the unlocked configuration.

The lock member 170 is initially positioned in or rotated about the hinge 184 to a nonlocking or open position as shown in FIGS. 3 and 4 to provide clearance for insertion of the module 140.

The module 140 is then axially inserted into the receiver slot 120 in an insertion direction I along the axis A-A through the front opening 120A. The side legs of the perimeter flanges 154 are received in the side legs of the perimeter grooves 134, thereby guiding the module 140 as it is inserted. The module 140 is pushed back into the receiver slot 120 until the rear end of the module 140 substantially engages the front side of the rear housing section 112A. The grooves 134 and flanges 154 mate and align the module 140 with the base 110 and axially guide the sliding movement of the module 140. The contacts 164 are received in the contact sockets 130. The voltage selector pins 150 are received in the sockets 132. The remote control pin 136 is depressed by the module 140, thereby providing feedback through the remote control connector that the module 140 has been seated in the base 110.

With the module 140 seated in the receiver slot 120, the lock member 170 is rotated in the latching direction M until the lock member 170 assumes the locking or closed position as shown in FIGS. 1, 2, 5 and 6. As the lock member 170 transitions to the closed position, the latch feature 176 is forcibly pushed over the lip 182B and may be outwardly elastically deflected in a direction Q (FIG. 6). After clearing the lip 182B, the latch finger 176B seats in the recess 182A. The lock member latch feature 176 is thereby interlocked with the module latch feature 182. The body 172 of the lock member 170 is received in a recess 159 defined in the bottom side of the module 140 by the lower perimeter flange 154.

With the locking mechanism 171 in the locking position (as shown in FIGS. 1, 2, 5 and 6), the module 140 is secured in the receiver slot 120 and displacement or withdrawal of the module 140 from the base 110 is thereby substantially prevented or inhibited. The interlock between the lock member 170 and the module 140 prevents or inhibits axial displacement of the module 140 out of the receiver slot 120. The interlock between the perimeter grooves 134 and the perimeter flanges 154, as well as the engagement between the contacts 164A, pins 150, and sockets 130, 132, prevents or inhibits lateral displacement of the module 140 out of the receiver slot 120.

In some embodiments and as shown, the distal end 170B of the lock member 170 is axially inset or substantially coplanar with the front face or wall 142B of the module 140 when the module 140 is locked in the base 110 by the locking mechanism 171.

In some embodiments, the depth D4 (FIG. 6) of the recess 182A is in the range of from about 0.2 to 5 mm. In some embodiments, the depth D3 (FIG. 6) of the latch finger 176B into the recess 182A is in the range of from about 0.2 to 5 mm.

In some embodiments, the lock member body 172 is substantially fully received in the recess 154A. As a result, the locking mechanism 171 presents a low profile in use. In some embodiments, the nominal thickness T1 of the body 172 is in the range of from about 0.3 to 6 mm.

In some embodiments and as shown, the module 140 projects forwardly beyond the front end of the receiver slot 120 a distance D1 (FIG. 5). In some embodiments, the distance D1 is in the range of from about 1 to 100 mm. In some embodiments, the module 140 extends into the receiver slot 120 a distance D2 (FIG. 5) in the range of from about 5 to 70 mm.

The module 140 can be released and removed from the base 110 by executing a reverse of the foregoing procedure. The lock member 170 is forced downwardly in the unlatching direction N to dislodge the latch feature 176 from the latch feature 182. The lock member 170 may again be elastically deflected to permit the latch finger 176B to clear the lip 182B. With the lock member 170 in the unlocked or open position, the module 140 can be axially withdrawn or slid out from the receiver slot 120. The tab 178 can be used by the operator to pull the lock member 170 away from the module latch feature 182.

The foregoing steps of mounting and removing the module 140 or other suitably configured modules in and from base 110 can be repeated multiple times. For example, in the event that the functional component 166 of the module 140 is degraded or destroyed or no longer of proper specification for the intended application, the module 140 can be replaced with a fresh or suitably constructed module.

The system 101 and locking mechanism 171 can provide a number of benefits and advantages. The locking mechanism 171 provides a secure but selectively releasable interlock. The locking mechanism 171 can prevent or inhibit the module 140 from being dislodged from the base 110 as a result of vibration or being impacted.

The locking mechanism 171 can be both locked and unlocked with one hand and without use of tools. The configuration of the locking mechanism 171 makes its use and operation intuitive and straightforward so that no pre-instruction or training is required of the operator.

The components and features of the locking mechanism 171 remain attached to the module 140 or the base 110 during the locking and unlocking movements and thereafter.

The locking mechanism 171 has a thin design and presents a low profile when locked.

During manufacture, it is only necessary to click mount or snap the lock member 170 into groove 182 of the hinge feature 180.

The system 101 can be manufactured or converted to use a module of a different length than the module 140. In this case, it is only necessary to replace the lock member 170 in the base hinge feature 180 with a lock member 170 having a length corresponding to that of the intended module (i.e., a longer lock member 170 for a longer module 140 or a shorter lock member 170 for shorter module 140).

Figure 8:
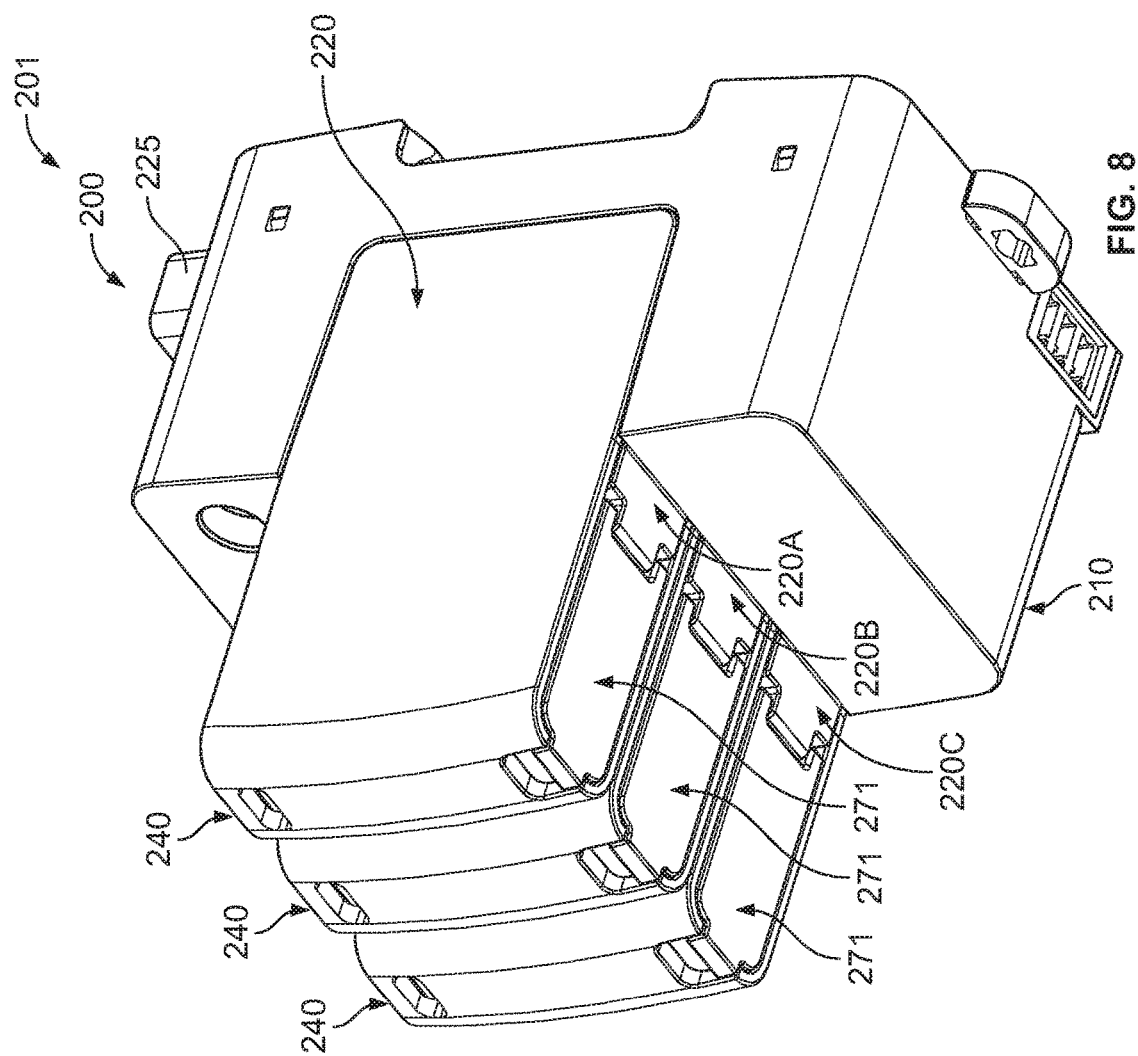
FIG. 8 is a bottom, front perspective view of a DIN rail device mount system and a DIN rail device mount assembly according to further embodiments of the invention, wherein the DIN rail device mount system is in a locked configuration.
Figure 9:
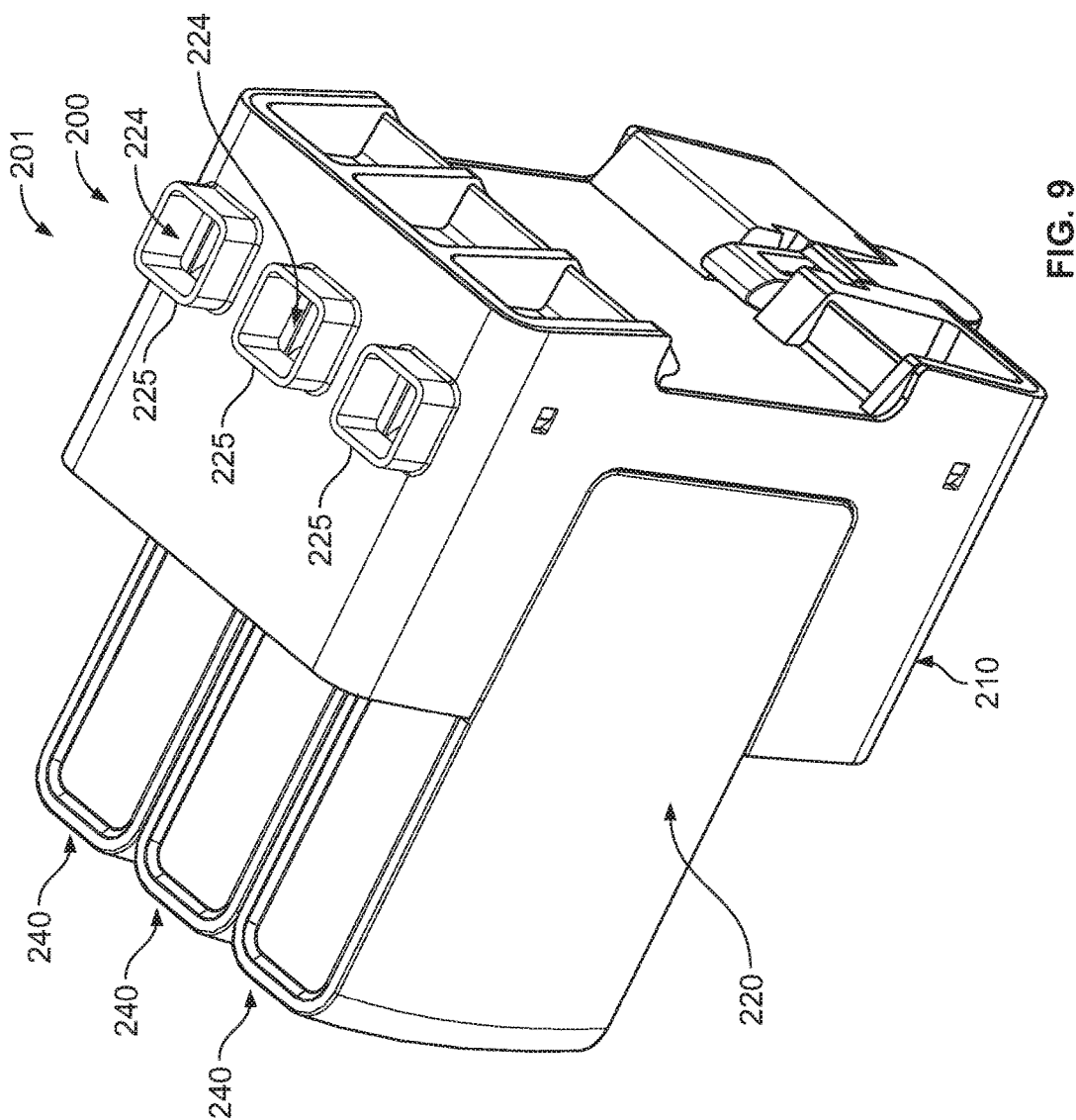
FIG. 9 is a top, rear perspective view of the DIN rail device mount system of FIG. 8.

With reference to FIGS. 8 and 9, a DIN rail device mount system 201 according to further embodiments is shown therein. The system 201 includes a DIN rail device mount assembly 200 corresponding to the DIN rail device mount assembly 100 except as follows.

The assembly 200 includes a base 210, multiple (as shown, three) modules 240, and four locking mechanisms 371. The base 210 may be constructed in the same manner as the base 110 except that it includes four side-by-side receiver slots 220A-C collectively forming a combined receiver slot 220. The modules 240 may each be constructed as described for the module 140 and may be configured the same or differently from one another. The locking mechanisms 271 are each configured as described for the locking mechanism 171.

In use, each of the modules 240 can be inserted into each of the receiver slots 220A-C and locked in place using the locking mechanism 271 associated with chosen receiver slot 220A-C. Each module 240 can likewise be unlocked and removed from the base 210 as described above. The modules 240 can be installed and removed from the base 210 independently of one another. The locking mechanisms 271 can be operated independently of one another.

The base 210 is also provided with integral, tubular extensions 225 projecting outwardly from the cable ports 224. The extensions 225 can provide increased electrical insulation between the cables.

DIN rail device mount assemblies of the invention can be configured to have other than one or three module slots and locking mechanisms (i.e., two or more than three).

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims, therefore, are to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A DIN rail device mount system comprising:
   a base configured to be mounted on a DIN rail, the base defining a receiver slot;
   a module configured to be removably mounted in the receiver slot to form a DIN rail mount assembly; and
   a locking mechanism including:
      a lock member having opposed proximal and distal ends and including an integral lock member latch feature on its distal end, wherein the lock member is pivotally connected to the base at its proximal end to pivot between a closed position and an open position; and
      an integral module latch feature on the module;
   wherein the DIN rail mount system is selectively positionable in each of:
      a locked configuration wherein the module is seated in the receiver slot, the lock member is in the closed position, and the lock member latch feature is interlocked with the module latch feature, whereby the lock member secures the module in the receiver slot; and an unlocked configuration wherein the lock member is in the open position, the lock member latch feature is not interlocked with the module latch feature, and the module can be withdrawn from the receiver slot; and wherein, when the DIN rail mount system is in the locked configuration:
a distal end portion of the module extends outwardly beyond a distal end of the receiver slot;
the lock member is seated in a recess defined in the distal end portion of the module; and
the lock member is axially inset from or coplanar with a front face of the distal end portion of the module; and wherein:
the module includes a perimeter flange extending along an outer lateral side edge of the module;
the perimeter flange aligns the module with the base as the module is inserted into the receiver slot;
the perimeter flange defines an inset recess;
the lock member includes a lock member body integral with the lock member latch feature; and
when the DIN rail mount system is in the locked configuration, the lock member body is substantially fully received in the inset recess.

2. The DIN rail device mount system of claim 1 wherein:
the module latch feature includes a latch feature recess defined in the module; and
the lock member latch feature includes a latch finger configured to be received in the latch feature recess to interlock the lock member latch feature with the module latch feature.

3. The DIN rail device mount system of claim 2 wherein:
the latch feature recess is defined in the distal end portion of the module; and
the latch finger is located on the distal end of the lock member.

4. The DIN rail device mount system of claim 1 wherein:
the base includes an integral base guide feature; and
the perimeter flange and the base guide feature align the module with the base as the module is inserted into the receiver slot and, when the DIN rail mount system is in the locked configuration, prevent the module from being laterally displaced from the receiver slot.

5. The DIN rail device mount system of claim 4 wherein:
the base guide feature includes a perimeter groove extending along an outer lateral side edge of the base adjacent the receiver opening.

6. The DIN rail device mount system of claim 1 wherein:
the module includes a module housing defining a cavity; and
an overvoltage protection device mounted in the cavity.

7. The DIN rail device mount system of claim 1 wherein:
the base includes a second receiver slot; and
the DIN rail device mount system includes:
a second module; and
a second locking mechanism including:
a second lock member having opposed proximal and distal ends and including a second integral lock member latch feature on its distal end, wherein the second lock member is pivotally connected to the base at its proximal end to pivot between a closed position and an open position; and
a second integral module latch feature on the second module; and
the DIN rail mount system is selectively positionable in each of:
a locked configuration wherein the second module is seated in the second receiver slot, the second lock member is in the closed position, and the second lock member latch feature is interlocked with the second module latch feature, whereby the second lock member secures the second module in the second receiver slot; and
an unlocked configuration wherein the second lock member is in the open position, the second lock member latch feature is not interlocked with the second module latch feature, and the second module can be withdrawn from the second receiver slot.

8. The DIN rail device mount system of claim 1 wherein the base includes a DIN rail mount receiver channel configured to receive a DIN rail to secure the base to the DIN rail.

9. The DIN rail device mount system of claim 1 wherein, when the DIN rail mount system is in the locked configuration, the lock member is substantially fully received in the inset recess and the module latch feature.

10. The DIN rail device mount system of claim 9 wherein:
the module latch feature includes a latch feature recess defined in the distal end portion of the module;
the lock member latch feature includes a latch finger configured to be received in the latch feature recess to interlock the lock member latch feature with the module latch feature; and
the latch finger is located on the distal end of the lock member.

11. A method for using a DIN rail device mount system, the method comprising:
providing a DIN rail device mount system including:
a base configured to be mounted on a DIN rail, the base defining a receiver slot;
a module configured to be removably mounted in the receiver slot to form a DIN rail mount assembly; and
a locking mechanism including:
a lock member having opposed proximal and distal ends and including an integral lock member latch feature on its distal end, wherein the lock member is pivotally connected to the base at its proximal end to pivot between a closed position and an open position; and
an integral module latch feature on the module; and
selectively positioning the DIN rail mount system in each of:
a locked configuration wherein the module is seated in the receiver slot, the lock member is in the closed position, and the lock member latch feature is interlocked with the module latch feature, whereby the lock member secures the module in the receiver slot; and
an unlocked configuration wherein the lock member is in the open position, the lock member latch feature is not interlocked with the module latch feature, and the module can be withdrawn from the receiver slot;
wherein, when the DIN rail mount system is in the locked configuration:
a distal end portion of the module extends outwardly beyond a distal end of the receiver slot;
the lock member is seated in a recess defined in the distal end portion of the module; and the lock member is axially inset from or coplanar with a front face of the distal end portion of the module; and wherein:
the module includes a perimeter flange extending along an outer lateral side edge of the module;
the perimeter flange aligns the module with the base as the module is inserted into the receiver slot;
the perimeter flange defines an inset recess;
the lock member includes a lock member body integral with the lock member latch feature; and
when the DIN rail mount system is in the locked configuration, the lock member body is substantially fully received in the inset recess.

12. The method of claim 11 wherein:
the module latch feature includes a latch feature recess defined in the module; and
the lock member latch feature includes a latch finger configured to be received in the latch feature recess to interlock the lock member latch feature with the module latch feature.

13. The method of claim 12 wherein:
the latch feature recess is defined in the distal end portion of the module; and
the latch finger is located on the distal end of the lock member.

14. The method of claim 11 wherein:
the base includes an integral base guide feature; and
the perimeter flange and the base guide feature align the module with the base as the module is inserted into the receiver slot and, when the DIN rail mount system is in the locked configuration, prevent the module from being laterally displaced from the receiver slot.

15. The method of claim 14 wherein
the base guide feature includes a perimeter groove extending along an outer lateral side edge of the base adjacent the receiver opening.

16. The method of claim 11 wherein:
the module includes a module housing defining a cavity; and
an overvoltage protection device mounted in the cavity.

17. The method of claim 11 wherein:
the base includes a second receiver slot; and
the DIN rail device mount system includes:
a second module; and
a second locking mechanism including:
a second lock member having opposed proximal and distal ends and including a second integral lock member latch feature on its distal end, wherein the second lock member is pivotally connected to the base at its proximal end to pivot between a closed position and an open position; and
a second integral module latch feature on the second module; and
the method further includes selectively positioning the DIN rail mount system in each of:
a locked configuration wherein the second module is seated in the second receiver slot, the second lock member is in the closed position, and the second lock member latch feature is interlocked with the second module latch feature, whereby the second lock member secures the second module in the second receiver slot; and
an unlocked configuration wherein the second lock member is in the open position, the second lock member latch feature is not interlocked with the second module latch feature, and the second module can be withdrawn from the second receiver slot.

18. The method of claim 11 wherein:
the base includes a DIN rail mount receiver channel; and
the method includes mounting the base on the DIN rail such that the DIN rail is received in the DIN rail mount receiver channel to secure the base to the DIN rail.

19. The method of claim 11 wherein, when the DIN rail mount system is in the locked configuration, the lock member is substantially fully received in the inset recess and the module latch feature.

20. The method of claim 19 wherein:
the module latch feature includes a latch feature recess defined in the distal end portion of the module;
the lock member latch feature includes a latch finger configured to be received in the latch feature recess to interlock the lock member latch feature with the module latch feature; and
the latch finger is located on the distal end of the lock member.

* * * * *